(12) United States Patent
Brown, Jr.

(10) Patent No.: US 9,577,576 B1
(45) Date of Patent: Feb. 21, 2017

(54) BIASED PASSIVE MIXER

(71) Applicant: QUALCOMM Incorporated, San Diego, CA (US)

(72) Inventor: Gary Lee Brown, Jr., Carlsbad, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 15/189,773

(22) Filed: Jun. 22, 2016

(51) Int. Cl.
| | |
|---|---|
| G06G 7/12 | (2006.01) |
| H03D 7/12 | (2006.01) |
| H03F 3/19 | (2006.01) |
| H03F 3/45 | (2006.01) |

(52) U.S. Cl.
CPC ............... *H03D 7/125* (2013.01); *H03F 3/19* (2013.01); *H03F 3/45179* (2013.01); *H03F 2200/294* (2013.01); *H03F 2200/451* (2013.01); *H03F 2203/45112* (2013.01)

(58) Field of Classification Search
CPC .. H03D 7/1458; H03D 7/1466; H03D 7/1475; H03D 7/1483; H03D 7/1491
USPC .......................... 327/355–361; 455/323, 326
See application file for complete search history.

(56) References Cited

U.S. PATENT DOCUMENTS

| | | | |
|---|---|---|---|
| 6,807,407 B2 | 10/2004 | Ji | |
| 6,972,610 B2 | 12/2005 | Behzad | |
| 7,126,424 B2 * | 10/2006 | Klein | H03F 3/45677 |
| | | | 330/258 |
| 7,164,901 B2 * | 1/2007 | Zheng | H03D 3/008 |
| | | | 375/320 |
| 7,899,431 B2 | 3/2011 | Rahman et al. | |
| 8,000,676 B2 * | 8/2011 | Kim | H04B 1/30 |
| | | | 455/298 |
| 8,010,074 B2 * | 8/2011 | Kaczman | H03D 7/165 |
| | | | 455/296 |
| 8,615,205 B2 * | 12/2013 | Choksi | H03D 3/009 |
| | | | 455/115.1 |
| 8,624,658 B1 | 1/2014 | Jones et al. | |
| 9,258,018 B2 | 2/2016 | Uehara et al. | |

* cited by examiner

*Primary Examiner* — Dinh T Le
(74) *Attorney, Agent, or Firm* — Patterson & Sheridan, L.L.P.

(57) ABSTRACT

Certain aspects of the present disclosure provide techniques and circuits for frequency mixing signals. One example circuit generally includes a transformer comprising a primary winding and a secondary winding, the transformer configured to generate a signal across the secondary winding based on a signal at an input node coupled to the primary winding, and a first mixer coupled to the secondary winding of the transformer and configured to convert a frequency of the signal across the secondary winding. In certain aspects, the circuit also includes a biasing circuit having an output coupled to a tap of the secondary winding and configured to generate a biasing voltage by applying an offset voltage to a common-mode voltage of the first mixer and apply the biasing voltage to the tap of the secondary winding to bias the first mixer.

30 Claims, 9 Drawing Sheets

BIASED PASSIVE MIXER

TECHNICAL FIELD

Certain aspects of the present disclosure generally relate to electronic circuits and, more particularly, to a circuit for frequency mixing signals.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

MSs and BSs may include circuitry for converting a frequency of a received signal. For example, the frequency of the received signal may be reduced such that it can be processed more efficiently. For example, a mixer may be used to effectively multiply two input signals together, thereby producing an output signal having frequency components at the sum of and the difference of the two input signals' frequencies. If the two input signals have the same frequency, then the output signal may have frequency components at DC and at twice the frequency of the input signal. Mixers may be implemented using transistors, such as metal-oxide semiconductor field-effect transistors (MOSFETs).

SUMMARY

Certain aspects of the present disclosure generally relate to frequency mixing signals.

Certain aspects of the present disclosure provide a circuit. The circuit generally includes a transformer comprising a primary winding and a secondary winding, the transformer configured to generate a signal across the secondary winding based on a signal at an input node coupled to the primary winding, a first mixer coupled to the secondary winding of the transformer and configured to convert a frequency of the signal across the secondary winding, and a biasing circuit having an output coupled to a tap of the secondary winding and configured to generate a biasing voltage by applying an offset voltage to a common-mode voltage of the first mixer and apply the biasing voltage to the tap of the secondary winding to bias the first mixer.

Certain aspects of the present disclosure provide a method for mixing signals. The method generally includes providing an input signal to a primary winding of a transformer such that a first signal is generated across a secondary winding of the transformer, generating a biasing voltage by applying an offset voltage to a common-mode voltage of a first mixer, applying the biasing voltage to a tap of the secondary winding of the transformer, and operating the first mixer to mix the first signal with a second signal.

Certain aspects of the present disclosure provide an apparatus for mixing signals. The apparatus generally includes means for transforming an input signal across a first inductive element into a first signal across a second inductive element, means for mixing the first signal with a second signal, means for generating a biasing voltage by applying an offset voltage to a common-mode voltage of the means for mixing, and means for biasing the means for mixing with the biasing voltage using the second inductive element of the means for transforming.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
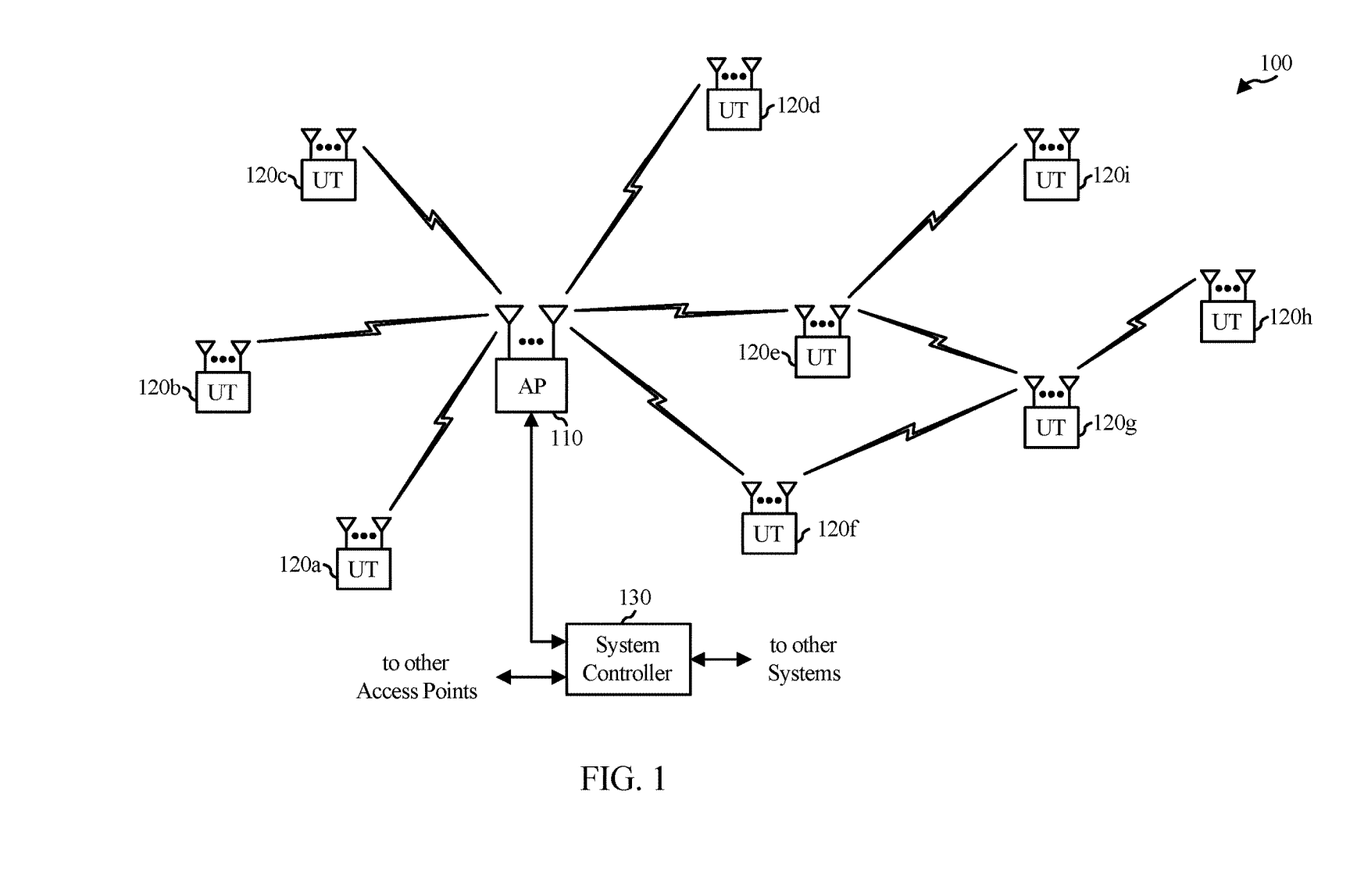
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include one or more mixers used to convert a frequency of a signal. In certain aspects of the present disclosure, an input signal may be provided to the mixer via a transformer, and the mixer may be biased via a center tap of the transformer, as described below.

Figure 2:
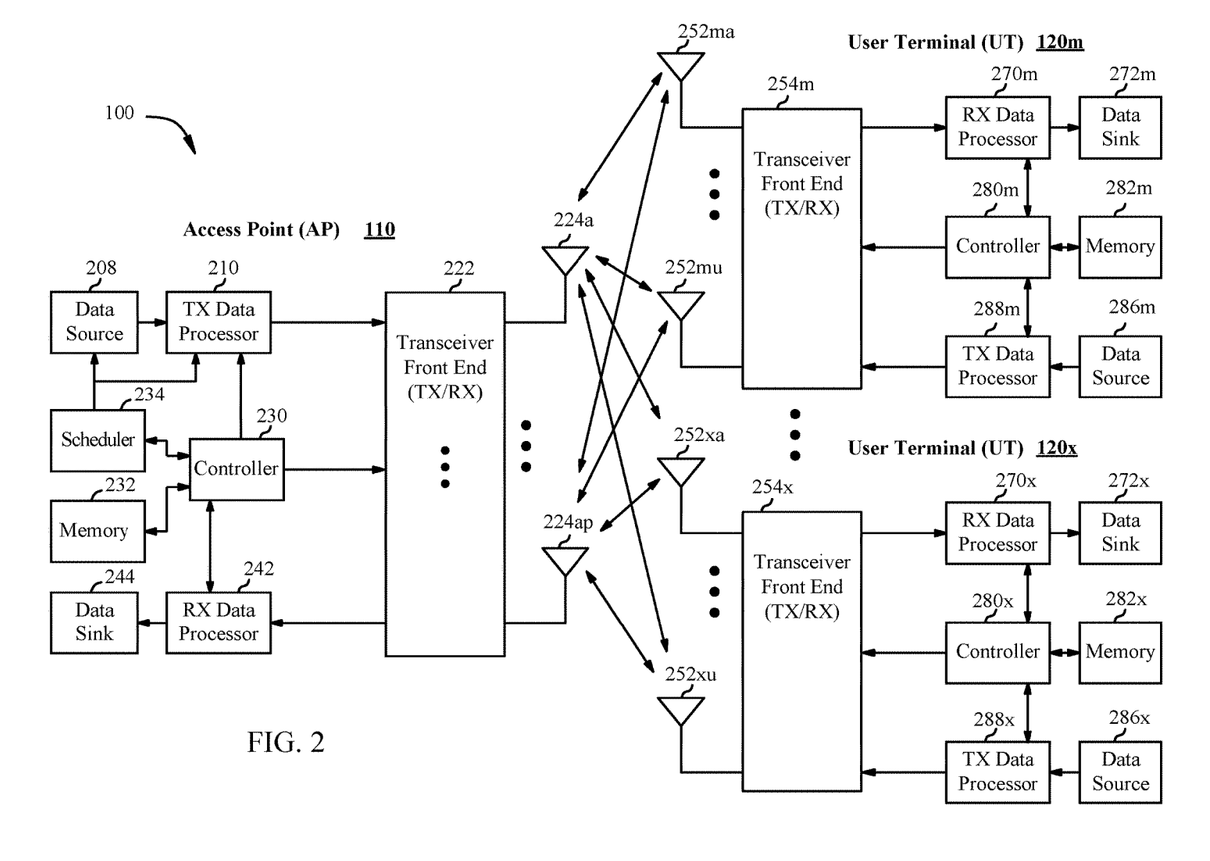
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may include one or more mixers used to convert a frequency of a signal. In certain aspects of the present disclosure, an input signal may be provided to the mixer via a transformer, and the mixer may be biased via a center tap of the transformer, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
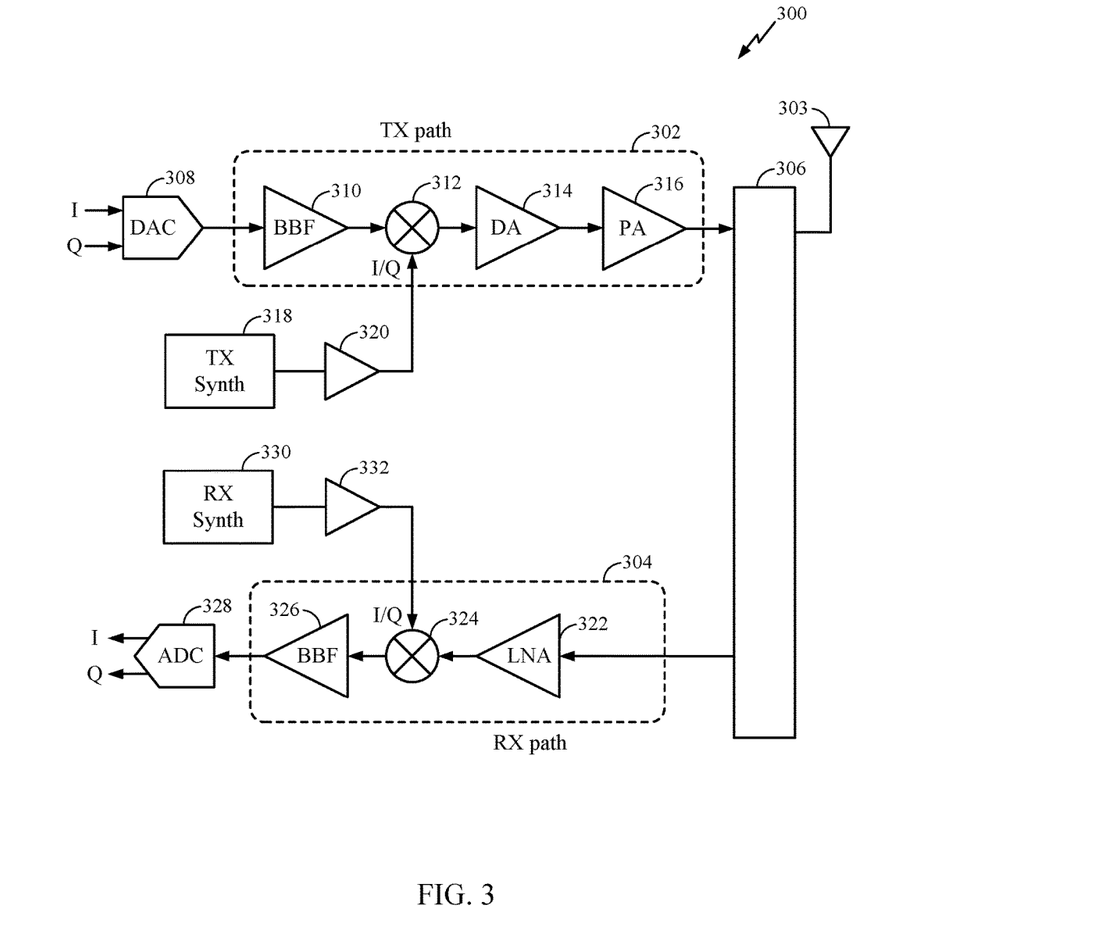
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

In some aspects of the present disclosure, an input RF signal may be provided to the mixer 324 via a transformer, and the mixer 324 may be biased via a center tap of the transformer, as described below.

Example Biased Passive Mixer

Aspects of the present disclosure are generally directed to biasing one or more mixers to improve linearity, and in turn, improve intermodulation distortion products (IDP) associated with the mixers. A mixer effectively multiplies two input signals together (e.g., an LO signal and an RF signal), thereby producing an output signal having frequency components at the sum of and the difference of the two input signals' frequencies. If the two input signals have the same frequency, then the output signal has frequency components at DC and at twice the frequency of the input signal. For example, if the input signals are oscillating signals with a frequency of 2 GHz, then the output signal has frequency components at DC and at 4 GHz. Mixers may be implemented using transistors, such as metal-oxide semiconductor field-effect transistors (MOSFETs).

Figure 4:
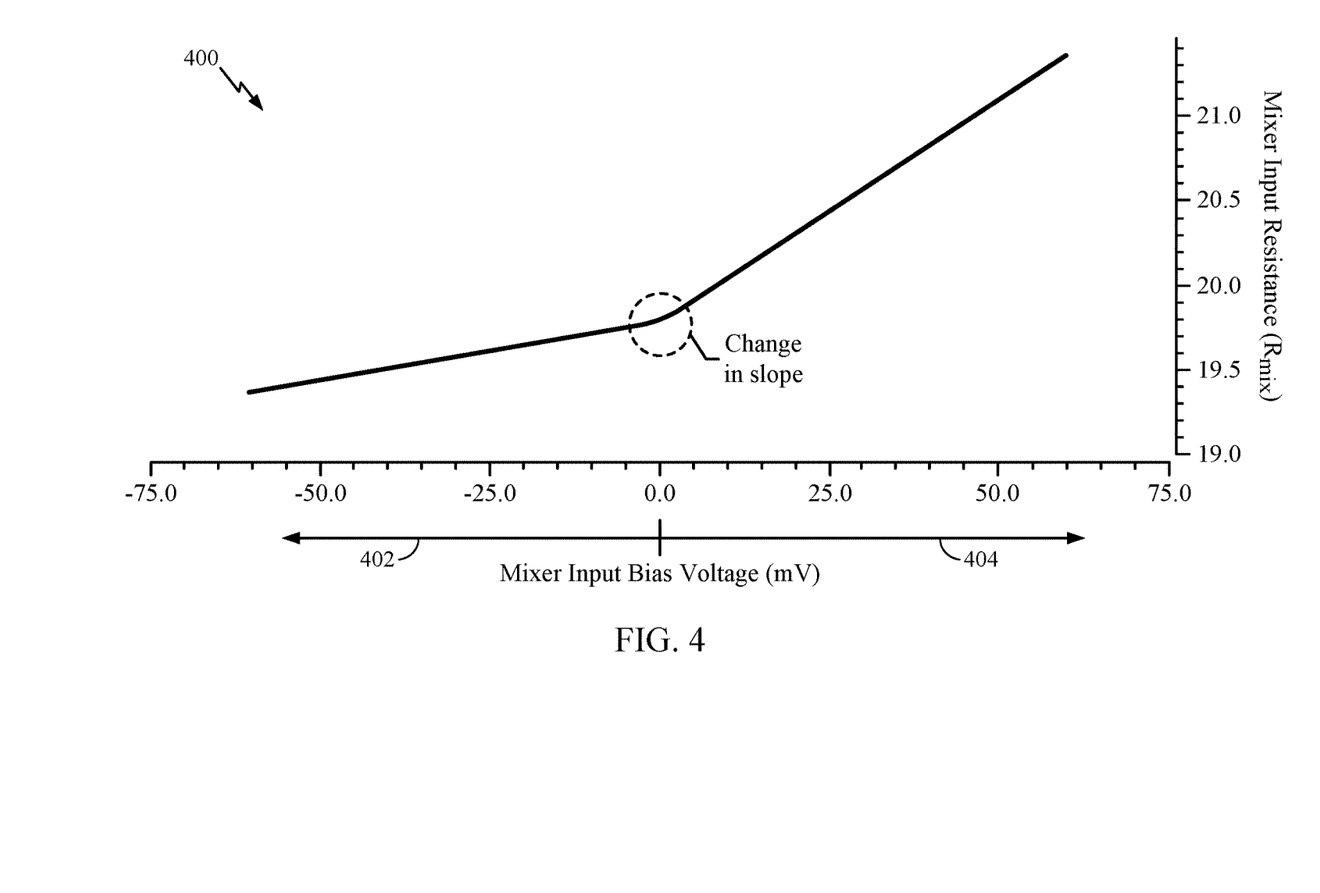
FIG. 4 is an example graph illustrating input resistance of a mixer as a function of mixer input signal bias voltage.

FIG. 4 is a graph 400 illustrating the input resistance (Rmix) of a mixer (e.g., mixer 324) as a function of the mixer input signal bias voltage. As illustrated, while the mixer input resistance Rmix may be linear within voltage ranges above and below a common-mode voltage (Vcm) of the mixer (e.g., zero volts), the slope of Rmix with respect to the input bias voltage changes at Vcm as shown by the "knee" in the curve of the graph 400. Thus, a linear region 402 may exist at mixer input voltages that are less than or equal to Vcm, and another linear region 404 may exist at mixer input voltages that are greater than or equal to Vcm. For example, for input voltages that are less than Vcm, the gate-to-source voltages (Vgs) of transistors of a mixer may change as a function of the mixer input voltage due to the mixer input being connected to the sources of the mixer transistors. Thus, as the mixer input voltage decreases, Vgs increases, thereby more strongly turning on the transistors of the mixer. However, Vgs of transistors of the mixer may be fixed with input voltages greater than Vcm, and as a result, there may be different slopes for Rmix above and below Vcm, as illustrated in the graph 400.

Thus, if the input signal voltage range of a mixer crosses Vcm, the change in slope of the input resistance of the mixer at Vcm may have an adverse effect on the linearity of the mixer. Aspects of the present disclosure provide a technique for biasing a mixer's input signal such that the voltage range of the input signal does not cross Vcm, thereby improving linearity of the mixer, and of a circuit path (e.g., Rx path 304) containing the mixer.

Figure 5A:
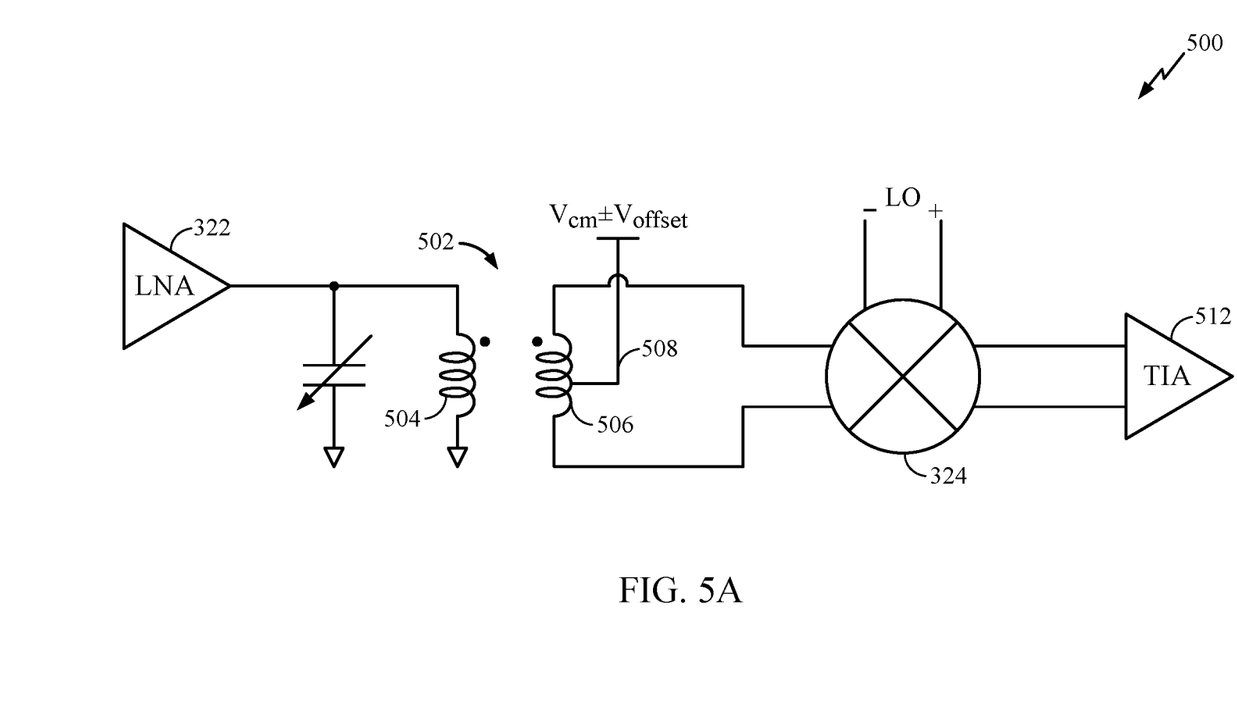
FIG. 5A illustrates an example receive (Rx) path with a circuit for biasing an input signal of a mixer, in accordance with certain aspects of the present disclosure.

FIG. 5A illustrates a portion of an example receive (Rx) path 500 with a circuit for biasing an input signal of a mixer 324, in accordance with certain aspects of the present disclosure. The LNA 322 may be configured to receive and amplify an RF signal. The amplified RF signal at the output of the LNA 322 may be provided to a primary winding 504 of a transformer 502. In some aspects, the turns ratio of the transformer 502 may be configured such that a voltage across the secondary winding 506 of the transformer 502 is different (e.g., higher) than the voltage of the amplified RF signal at the primary winding 504. As illustrated, the input to the mixer 324 may be coupled to the secondary winding 506 of the transformer 502, where the secondary winding is magnetically coupled to the primary winding 504.

The input to the mixer 324 may be biased by applying a bias voltage to a tap (e.g., the center tap 508) of the secondary winding 506. For example, the bias voltage applied to the center tap 508 may be equal to the Vcm of the mixer 324, adjusted by an offset voltage (Voffset). To improve the linearity of the mixer 324, Voffset may be selected such that the input signal voltage range of the mixer 324 does not cross Vcm. That is, Voffset may be selected such that the input signal voltage range of the mixer 324 is either greater than or equal to, or less than or equal to, Vcm. For example, if the voltage range of the input signal to the mixer is 100 mV, then the offset voltage may be selected to be at least 50 mV such that the input voltage range of the mixer 324 is −100 mV to 0 V (or less) in the case of a negative offset, or is 0 V to +100 mV (or greater) in the case of a positive offset. In other words, the offset voltage is selected such that input voltage range is shifted to a range that does not cross Vcm, and thus, the mixer 324 can be operated in a region of operation with improved linearity.

In some cases, an amplifier 512 (e.g. a transimpedance amplifier (TIA)) may be coupled to the output of the mixer 324. The amplifier 512 may be part of a baseband filter (e.g., BBF 326) or intermediate frequency (IF) filter for filtering (e.g., low-pass or bandpass filtering) the frequency-mixed signal generated by the mixer 324.

Figure 5B:
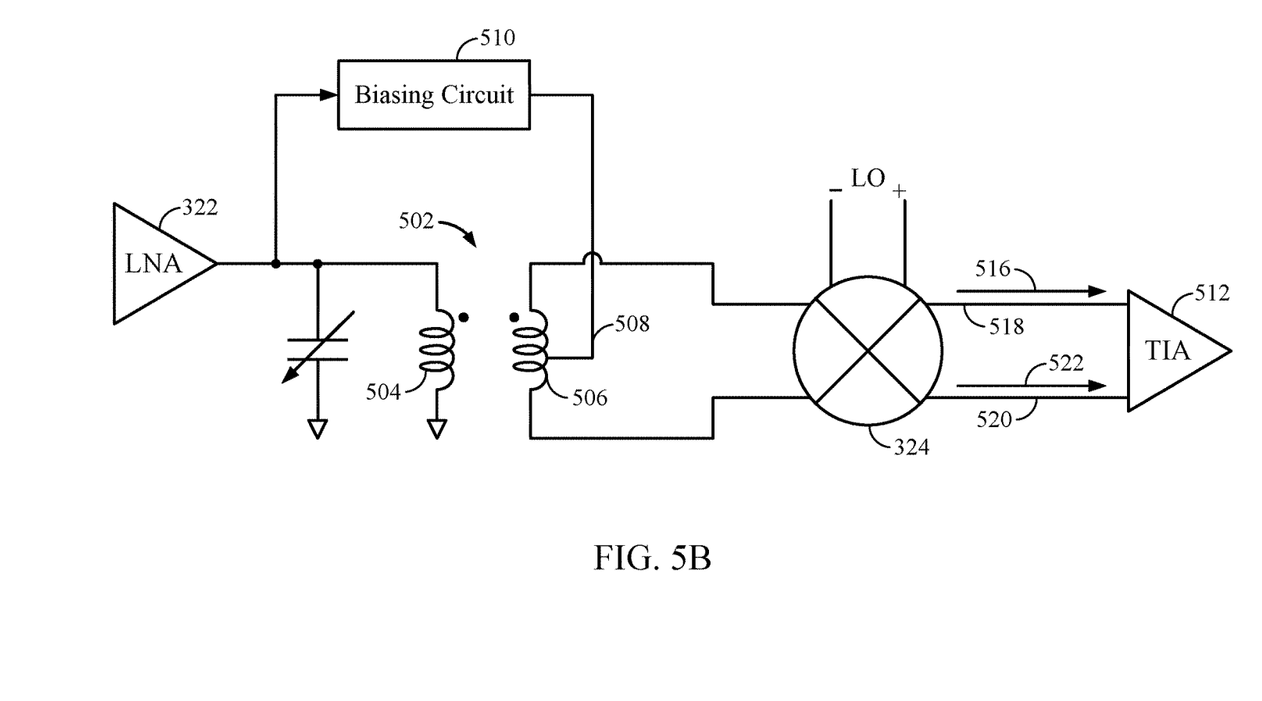
FIG. 5B illustrates an example Rx path with a circuit for biasing an input voltage of a mixer via a biasing circuit, in accordance with certain aspects of the present disclosure.

FIG. 5B illustrates a portion of an example Rx path with a circuit for biasing an input voltage of a mixer 324 via a biasing circuit 510, in accordance with certain aspects of the present disclosure. In certain aspects, the biasing circuit may be configured to generate the biasing voltage applied to tap 508 by applying the offset voltage (Voffset) to the Vcm of the mixer 324.

In certain aspects, the biasing circuit 510 may include a peak detector circuit configured to detect the magnitude of the amplified RF signal at the output of the LNA 322, and dynamically control the biasing voltage at a transformer winding tap (e.g., the center tap 508) based on the detected magnitude. For example, as the magnitude of the RF signal increases (e.g., due to a jamming signal), the biasing circuit 510 may increase the biasing voltage (e.g., increase Voffset) in order to shift the voltage range of the mixer input signal such that the voltage range does not cross Vcm. By increasing the biasing voltage based on the magnitude of the RF signal, the noise figure (NF) of the mixer 324 may be reduced. In certain aspects, instead of adjusting the biasing voltage at the center tap 508 by detecting the magnitude of the RF signal via the biasing circuit 510, a biasing circuit may be used to adjust the biasing voltage at the center tap 508 by detecting the magnitude of the mixer input signal across the secondary winding 506.

By biasing the input signal to the mixer 324 with Vcm±Voffset, a DC current (e.g., common-mode current) may be generated at the output of the mixer 324. Thus, the amplifier 512 may be configured such that the DC current from the mixer 324 may be sourced or sunk by the amplifier 512. For example, in a case where the input signal to the mixer 324 is biased with Vcm+Voffset, the DC current, represented by arrows 516 and 522, may flow from the output nodes 518 and 520 of the mixer 324 to the amplifier 512, which may be configured to absorb the DC current. For example, a common-mode feedback circuit may be used to sense the DC current and sink the DC current via a current source. In a case where the input signal to the mixer 324 is biased with Vcm−Voffset, the DC current may flow from the amplifier 512 to the output nodes 518 and 520 (in the opposite direction from arrows 516 and 522). In this case, the common-mode feedback circuit may source the DC current via a current source. However, in some cases, the DC current may flow to another mixer, coupled to the output of the mixer 324, as will be described with respect to FIG. 6A.

Figure 6A:
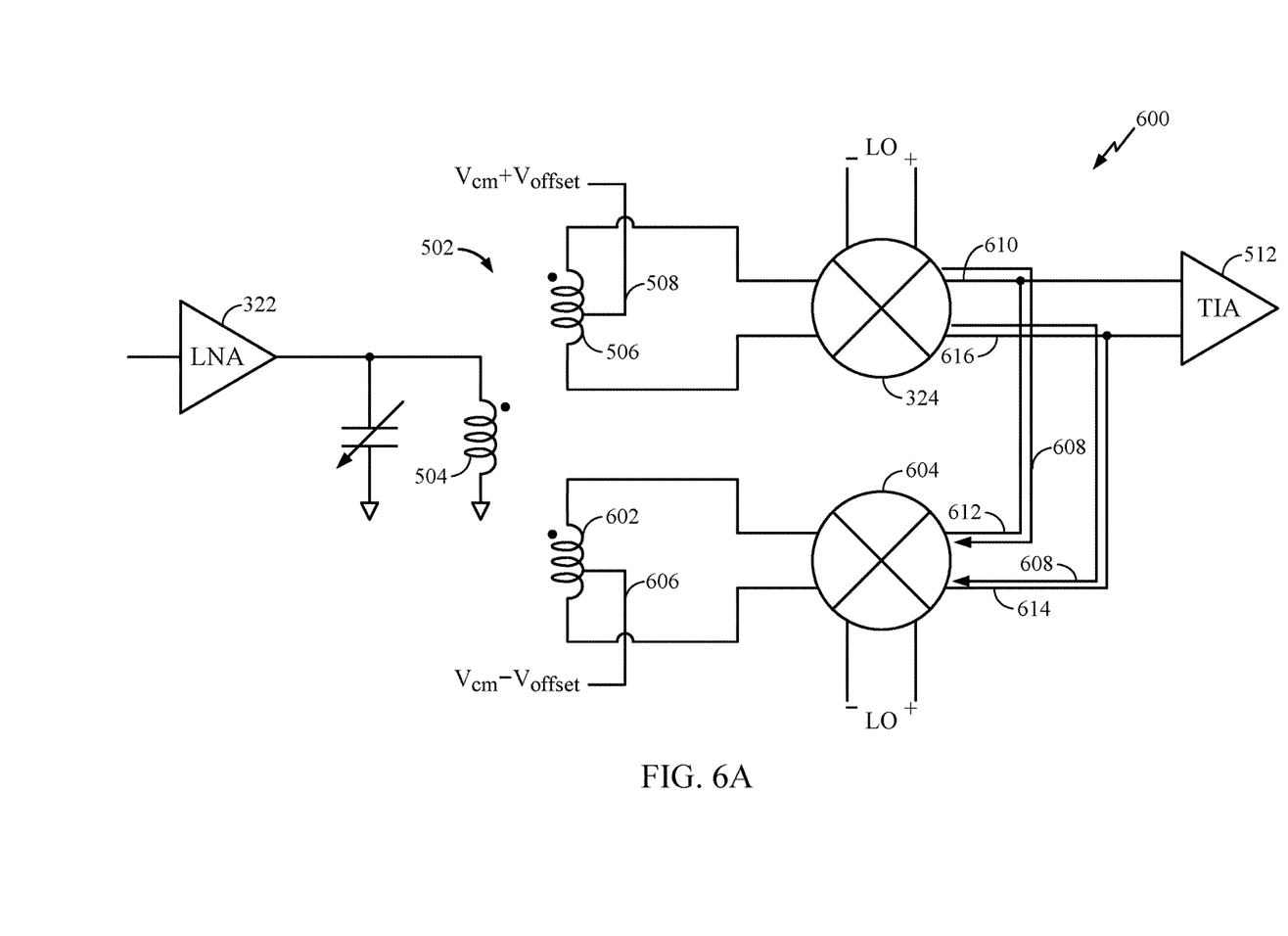
FIG. 6A illustrates an example Rx path with a circuit including two mixers having a combined output, in accordance with certain aspects of the present disclosure.

FIG. 6A illustrates a portion of an example Rx path 600 including two mixers having a combined output, in accordance with certain aspects of the present disclosure. For example, the transformer 502 may include another secondary winding 602 that is magnetically coupled to the primary winding 504. The secondary winding 602 may be coupled to another mixer 604, the output of which may be combined with the mixer 324 at summing nodes, as illustrated. In this case, the input signal of the mixer 324 may be biased via a winding tap of the secondary winding 506 (e.g., the center tap 508) at Vcm+Voffset, and the mixer 604 may be biased via a winding tap of the secondary winding 602 (e.g., the center tap 606) at Vcm−Voffset. Thus, returning to FIG. 4, the input signal of the mixer 324 may be biased to have a range that is in the linear region 404 greater than Vcm (e.g., 0 volts), and the input signal of the mixer 604 may be biased to have a range than is in the linear region 402 less than Vcm (e.g., 0 volts).

By biasing mixer 324 with a positive Voffset and mixer 604 with a negative Voffset, the DC current generated by biasing the mixers 324 and 604 can flow between the mixers 324 and 604. For example, in a case where the input signal to the mixer 324 is biased with Vcm+Voffset and the input signal to the mixer 604 is biased with Vcm−Voffset, a DC current, represented by arrows 608, may flow from the output nodes 610 and 616 of mixer 324 to the output nodes 612 and 614 of mixer 604. In a case where the input signal to the mixer 324 is biased with Vcm−Voffset and the input signal to the mixer 604 is biased with Vcm+Voffset, the DC current may flow to the output nodes 610 and 616 of mixer 324 from the output nodes 612 and 614 of mixer 604. Therefore, the DC current generated by biasing mixers 324 and 604 with Voffset may not flow in the amplifier 512. Moreover, as the output of the mixers 324 and 604 are combined, a gain of the mixers 324 and 604 may be improved as compared to using a single mixer 324.

Figure 6B:
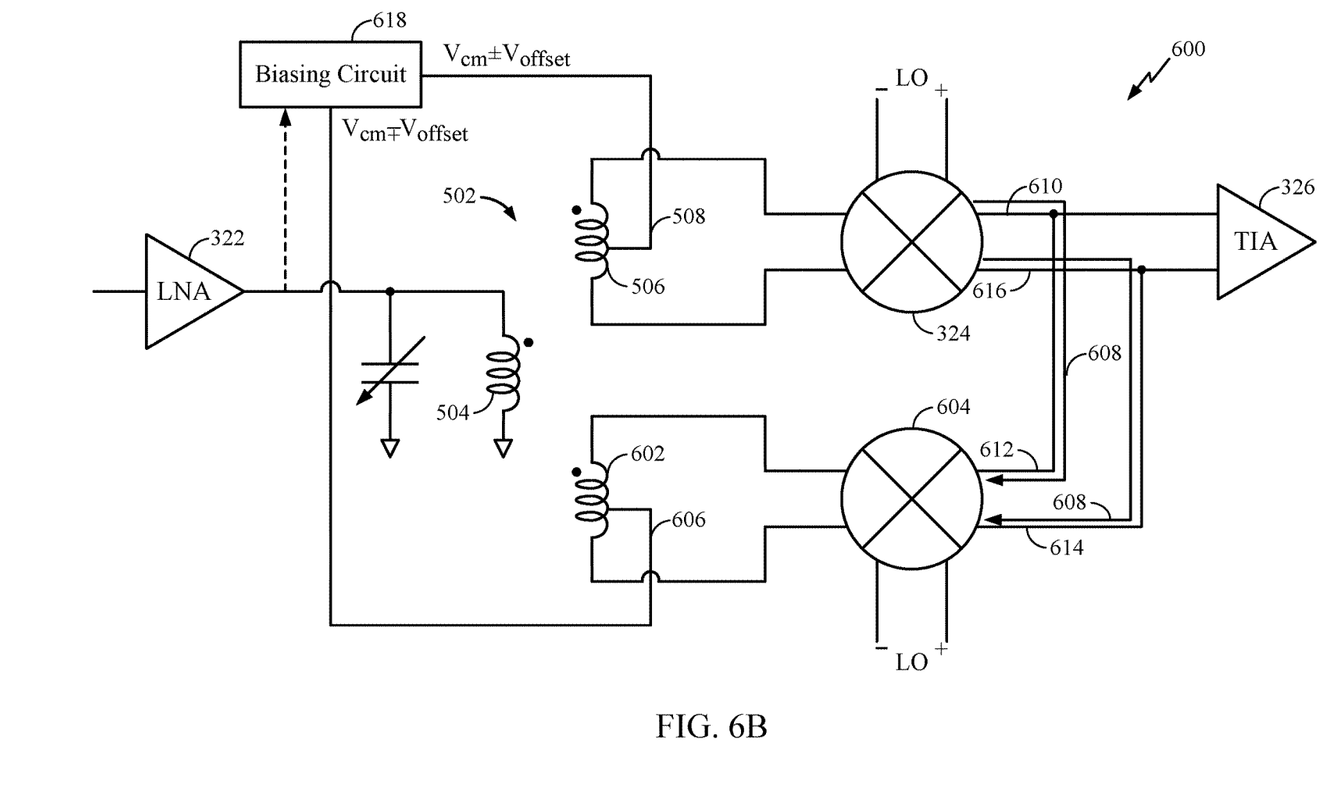
FIG. 6B illustrates an example Rx path with a circuit for biasing an input voltage of two mixers via a biasing circuit, in accordance with certain aspects of the present disclosure

FIG. 6B illustrates a portion of an example Rx path with a circuit for biasing an input voltage of two mixers 324, 604 via a biasing circuit 618, in accordance with certain aspects of the present disclosure. In certain aspects, the biasing circuit 618 may be configured to generate the biasing voltages to be applied to taps 508 and 606 by applying Voffset to the Vcm of the mixer 324 (or mixer 604).

In some aspects, the biasing circuit 618 may be used to detect the magnitude of the amplified RF signal at the output of the LNA 322 and dynamically adjust the biasing voltages (e.g., by adjusting Voffset) applied to the center taps 508 and 606 of the secondary windings 506 and 602, respectively, based on the detected magnitude. In some cases, the biasing circuit 618 may be configured to provide a biasing voltage to center taps 508 and 606 based on respective input signal magnitudes of mixers 324 and 604.

In certain aspects, the biasing circuit 618 may include a switching circuit configured to switch the biasing points of mixers 324 and 604. For example, during a first phase, the mixer 324 may be biased at Vcm+Voffset, and the mixer 604 may be biased at Vcm−Voffset. During a second phase, the mixer 324 may be biased at Vcm−Voffset, and the mixer 604 may be biased at Vcm+Voffset. In some cases, the biasing points of mixers 324 and 604 may be switched periodically at a frequency greater than the bandwidth of the RF signal. By switching the biasing points of mixers 324 and 604, the NF of mixers 324 and 604 may be decreased.

Aspects of the present disclosure improve linearity of mixers 324 and 604 by biasing mixers 324 and 604 into a linear region of operation (e.g., by avoiding the "knee" in the graph 400 of FIG. 4). Thus, by improving linearity, the third-order intermodulation intercept point (IIP3) of the mixers 324 and 604 may be improved. Aspects of the present disclosure may also provide improvements to the second-order intermodulation intercept point (IIP2) of the mixers 324 and 604.

Figure 7:
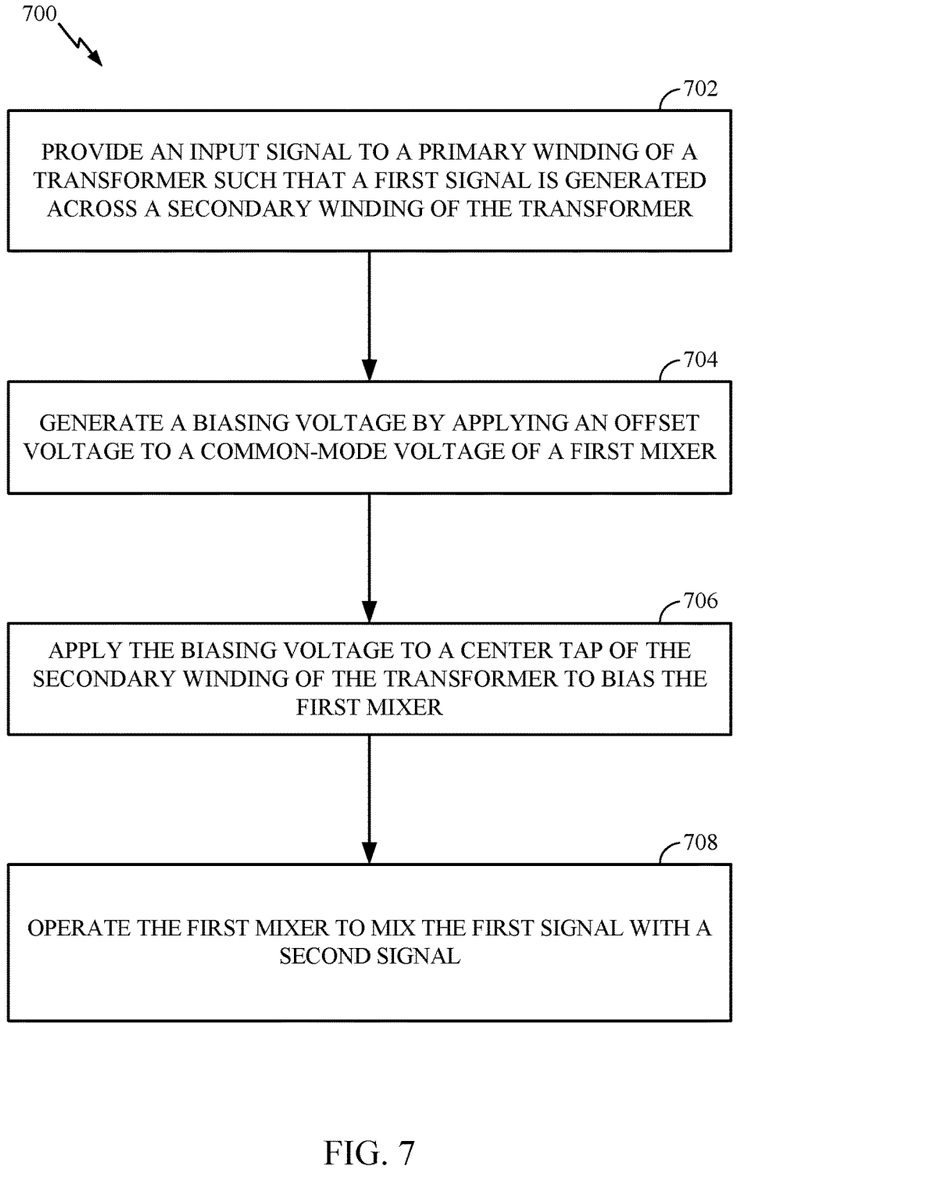
FIG. 7 is a flow diagram of example operations for mixing signals, in accordance with certain aspects of the present disclosure.

FIG. 7 is a flow diagram of example operations 700 for mixing signals, in accordance with certain aspects of the present disclosure. The operations 700 may be performed by a circuit, such as the circuits of FIGS. 5A-6B.

The operations 700 may begin, at block 702, by providing an input signal to a primary winding (e.g., primary winding 504) of a transformer (e.g., transformer 502) such that a first signal is generated across a secondary winding (e.g., secondary winding 506) of the transformer. At block 704, a biasing voltage is generated by applying an offset voltage (Voffset) to a common-mode voltage of a first mixer, and at block 706, the biasing voltage is applied to a tap (e.g., center tap 508) of the secondary winding of the transformer. The operations 700 continue at block 708, by operating a first mixer (e.g., mixer 324) to mix the first signal with a second signal.

In some aspects, the operations 700 also include setting the offset voltage to adjust a voltage swing across the secondary winding of the transformer such that the adjusted voltage swing is within a voltage range that does not cross the common-mode voltage. In some cases, the operations 700 also include detecting the magnitude of the input signal and setting the offset voltage based on the magnitude of the input signal. In certain aspects, the operations 700 include amplifying, with an amplifier (e.g., amplifier 512), a frequency mixed signal generated by the first mixer when mixing the first and second signals, wherein a direct-current (DC) current generated by the first mixer due to the offset voltage is sourced or sunk by the amplifier.

In some cases, another biasing voltage may be applied to a tap (e.g., center tap 606) of another secondary winding (e.g., secondary winding 602) of the transformer, wherein providing the input signal to the primary winding of the transformer generates a third signal across the other secondary winding. In this case, a second mixer (e.g., mixer 604) may be operated to mix the third signal with a fourth signal and a frequency mixed signal generated by the second mixer may be combined with a frequency mixed signal generated by the first mixer. In some aspects, the fourth signal may be the same as the second signal (e.g., a local oscillating signal). In certain aspects, the operations 700 further include generating the other biasing voltage by applying another offset voltage to the common-mode voltage. In certain aspects, the other biasing voltage comprises the common-mode voltage plus the other offset voltage (Vcm+Voffset), and the biasing voltage comprises the common-mode voltage minus the offset voltage (Vcm−Voffset). In some cases, the offset voltage and the other offset voltage have the same voltage magnitude.

In certain aspects, the operations 700 also include detecting the magnitude of the input signal, and setting at least one of the offset voltage or the other offset voltage based on the magnitude of the input signal. In other cases, the operations 700 may include detecting the magnitude of the first signal, and setting at least one of the offset voltage or the other offset voltage based on the first signal.

In certain aspects, the operations 700 include periodically switching the biasing voltage and the other biasing voltage between the taps of the secondary winding and the other secondary winding. In certain aspects, the first and second mixers comprise n-channel metal-oxide semiconductor (NMOS) transistors. In other aspects, the first and second mixers may comprise p-channel metal-oxide semiconductor (PMOS) transistors.

While the examples provided herein have described techniques for mixing signals to generate a single frequency mixed output signal, the techniques provided herein can be applied to multiple mixers configured to generate multiple frequency mixed output signals. For example, the frequency mixed output of the mixer 324 (or the combined output of mixers 324 and 604) as described with respect to FIGS. 5A-6B may be an in-phase (I) signal, and another mixer (or two mixers having a combined output) may be used to generate a quadrature (Q) signal. That is, the other mixer(s) may obtain the RF signal via the secondary winding(s) 506 and/or 606 and mix the RF signal with another LO signal (a Q LO signal), to generate a Q frequency mixed output signal. Used for quadrature combining, Q signals are 90° (or nearly 90°) out of phase with I signals.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for receiving may comprise a receiver (e.g., the transceiver front end 254 of the user terminal 120 depicted in FIG. 2, the transceiver front end 222 of the access point 110 shown in FIG. 2, or the transceiver front end 300 illustrated in FIG. 3) and/or an antenna (e.g., the antennas 252ma through 252mu of the user terminal 120m portrayed in FIG. 2, the antennas 224a through 224ap of the access point 110 illustrated in FIG. 2, or the antenna 303 of the transceiver front end 300 depicted in FIG. 3). Means for processing, means for determining, and means for operating may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2).

Means for transforming may comprise a transformer, such as the transformer 502 of FIGS. 5A-6B. Means for determining, means for generating, and means for biasing may include a voltage source or a biasing circuit, such as the biasing circuit 510 of FIG. 5B or the biasing circuit 618 of FIG. 6B. Means for biasing may also include a tap of an inductive element, such as the secondary winding 506 and/or secondary winding 602. Means for mixing may include a mixer, such as the mixer 324 or 604 of FIGS. 5A-6B. Means for combining may include one or more summing nodes, as illustrated in FIGS. 6A and 6B.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit comprising:
   a transformer comprising a primary winding and a secondary winding, the transformer configured to generate a signal across the secondary winding based on a signal at an input node coupled to the primary winding;
   a first mixer coupled to the secondary winding of the transformer and configured to convert a frequency of the signal across the secondary winding; and
   a biasing circuit having an output coupled to a tap of the secondary winding and configured to generate a biasing voltage by applying an offset voltage to a common-mode voltage of the first mixer, and apply the biasing voltage to the tap of the secondary winding to bias the first mixer.

2. The circuit of claim 1, wherein the biasing circuit is configured to set the offset voltage to adjust a voltage swing across the secondary winding of the transformer such that the adjusted voltage swing is within a voltage range that does not cross the common-mode voltage.

3. The circuit of claim 2, wherein the biasing circuit comprises a peak detector configured to detect the magnitude of the signal across the secondary winding, wherein the biasing circuit is configured to set the offset voltage based on the magnitude of the signal across the secondary winding.

4. The circuit of claim 1, further comprising an amplifier coupled to the first mixer and configured to receive a frequency mixed signal generated by the first mixer, wherein the amplifier is configured such that a direct-current (DC) current generated by the first mixer due to the offset voltage is sourced or sunk by the amplifier.

5. The circuit of claim 1, wherein the transformer further comprises another secondary winding, the circuit further comprising a second mixer coupled to the other secondary winding of the transformer, and wherein an output of the first mixer is coupled to an output of the second mixer.

6. The circuit of claim 5, wherein a summing node is configured to combine a frequency mixed signal generated by the second mixer with another frequency mixed signal generated by the first mixer.

7. The circuit of claim 5, wherein the biasing circuit has another output coupled to a tap of the other secondary winding and configured to generate another biasing voltage by applying another offset voltage to the common-mode voltage, and apply the other biasing voltage to the tap of the other secondary winding to bias the second mixer.

8. The circuit of claim 7, wherein:
   the other biasing voltage comprises the common-mode voltage plus the other offset voltage; and
   the biasing voltage comprises the common-mode voltage minus the offset voltage.

9. The circuit of claim 7, wherein the offset voltage and the other offset voltage have the same voltage magnitude.

10. The circuit of claim 7, wherein the biasing circuit comprises a peak detector configured to detect the magnitude of the signal at the input node, wherein the biasing circuit is configured to set at least one of the offset voltage or the other offset voltage based on the magnitude of the signal at the input node.

11. The circuit of claim 7, wherein the biasing circuit comprises a peak detector configured to detect the magnitude of the signal across the secondary winding, wherein the biasing circuit is configured to set at least one of the offset voltage or the other offset voltage based on the magnitude of the signal across the secondary winding.

12. The circuit of claim 7, wherein the biasing circuit comprises a switching circuit coupled to the secondary winding and the other secondary winding and configured to switch the biasing voltage and the other biasing voltage between the taps of the secondary winding and the other secondary winding.

13. The circuit of claim 7, wherein the first and second mixers are n-channel metal-oxide semiconductor (NMOS) mixers.

14. A method for mixing signals, comprising:
   providing an input signal to a primary winding of a transformer such that a first signal is generated across a secondary winding of the transformer;
   generating a biasing voltage by applying an offset voltage to a common-mode voltage of a first mixer;
   applying the biasing voltage to a tap of the secondary winding of the transformer to bias the first mixer; and
   operating the first mixer to mix the first signal with a second signal.

15. The method of claim 14, further comprising setting the offset voltage to adjust a voltage swing across the secondary winding of the transformer such that the adjusted voltage swing is within a voltage range that does not cross the common-mode voltage.

16. The method of claim 15, further comprising detecting the magnitude of the input signal, wherein setting the offset voltage comprises setting the offset voltage based on the magnitude of the input signal.

17. The method of claim 14, further comprising amplifying, with an amplifier, a frequency mixed signal generated by the first mixer when mixing the first and second signals, wherein a direct-current (DC) current generated by the first mixer due to the offset voltage is sourced or sunk by the amplifier.

18. The method of claim 14, further comprising:
applying another biasing voltage to a tap of another secondary winding of the transformer, wherein providing the input signal to the primary winding of the transformer generates a third signal across the other secondary winding;
operating a second mixer to mix the third signal with a fourth signal; and
combining a frequency mixed signal generated by the second mixer with a frequency mixed signal generated by the first mixer.

19. The method of claim 18, wherein the fourth signal is the same as the second signal.

20. The method of claim 18, further comprising generating the other biasing voltage by applying another offset voltage to the common-mode voltage.

21. The method of claim 20, wherein:
the other biasing voltage comprises the common-mode voltage plus the other offset voltage; and
the biasing voltage comprises the common-mode voltage minus the offset voltage.

22. The method of claim 20, wherein the offset voltage and the other offset voltage have the same voltage magnitude.

23. The method of claim 20, further comprising:
detecting the magnitude of the input signal; and
setting at least one of the offset voltage or the other offset voltage based on the magnitude of the input signal.

24. The method of claim 20, further comprising:
detecting the magnitude of the first signal; and
setting at least one of the offset voltage or the other offset voltage based on the first signal.

25. The method of claim 18, further comprising periodically switching the biasing voltage and the other biasing voltage between the taps of the secondary winding and the other secondary winding.

26. The method of claim 18, wherein the first and second mixers comprise n-channel metal-oxide semiconductor (NMOS) transistors.

27. An apparatus for mixing signals, comprising:
means for transforming an input signal across a first inductive element into a first signal across a second inductive element;
means for mixing the first signal with a second signal;
means for generating a biasing voltage by applying an offset voltage to a common-mode voltage of the means for mixing; and
means for biasing the means for mixing with the biasing voltage using the second inductive element of the means for transforming.

28. The apparatus of claim 27, wherein:
the means for transforming is further configured to transform the input signal across the first inductive element into a third signal across a third inductive element; and
the apparatus further comprises:
means for mixing the third signal with a fourth signal;
means for generating another biasing voltage by applying another offset voltage to the common-mode voltage; and
means for biasing the means for mixing the third and fourth signals with the other biasing voltage using the third inductive element of the means for transforming.

29. The apparatus of claim 28, further comprising means for combining a frequency mixed signal generated by the means for mixing the first and second signals with another frequency mixed signal generated by the means for mixing the third and fourth signals.

30. The apparatus of claim 28, wherein:
the other biasing voltage comprises the common-mode voltage plus the other offset voltage; and
the biasing voltage comprises the common-mode voltage minus the offset voltage.

* * * * *